United States Patent
Kim et al.

[11] Patent Number: 5,824,594
[45] Date of Patent: Oct. 20, 1998

[54] INTEGRATED CIRCUIT DEVICE ISOLATING METHODS INCLUDING SILICON SPACERS AND OXIDATION BARRIER FILMS

[75] Inventors: Sung-eui Kim, Cheju-do; Young-dae Kim, Kyungki-do, both of Rep. of Korea

[73] Assignee: Samsung Electronics Co., Ltd., Suwon, Rep. of Korea

[21] Appl. No.: 837,208

[22] Filed: Apr. 14, 1997

[30] Foreign Application Priority Data

Apr. 29, 1996 [KR] Rep. of Korea ....................... 96-13470
Jul. 23, 1996 [KR] Rep. of Korea ....................... 96-29884

[51] Int. Cl.$^6$ ........................................... H01L 21/76
[52] U.S. Cl. ...................... 438/446; 438/439; 438/445; 438/444
[58] Field of Search ..................... 438/444, 445, 438/446, 439

[56] References Cited

U.S. PATENT DOCUMENTS 5,457,067 10/1995 Han .......................... 438/445
5,512,509 4/1996 Han .......................... 438/446
5,629,230 5/1997 Fazan et al. ............... 438/446
5,658,822 8/1997 Wu et al. ................... 438/446

FOREIGN PATENT DOCUMENTS 0304927 12/1990 Japan .
0182956 7/1993 Japan .
0279555 10/1996 Japan .

OTHER PUBLICATIONS

Ahn et al., "A Highly Practice Modified LOCOS Isolation Technology for the 256 Mbit DRAM", IEDM Technical Digest, International Electron Devices Meeting 1994, Dec. 11–14, 1994, pp. 679–682.

Primary Examiner—Trung Dang
Attorney, Agent, or Firm—Myers Bigel Sibley & Sajovec

[57] ABSTRACT

An integrated circuit device is isolated by forming a pad oxide layer on an integrated circuit substrate. A mask pattern is formed on the pad layer. The mask pattern includes sidewalls which selectively expose the pad oxide layer between the sidewalls. A silicon spacer is formed on the sidewalls. An oxidation barrier film is formed on the silicon spacer and on the exposed pad oxide layer. The integrated circuit substrate is then oxidized through the oxidation barrier film to form a device isolating layer. The oxidation barrier film on the exposed pad oxide layer is thinner than the oxidation barrier film on the sidewalls. Thus, oxidation of the silicon spacer is delayed relative to the substrate.

20 Claims, 6 Drawing Sheets

INTEGRATED CIRCUIT DEVICE ISOLATING METHODS INCLUDING SILICON SPACERS AND OXIDATION BARRIER FILMS

FIELD OF THE INVENTION

This invention relates to integrated circuit device manufacturing methods, and more particularly to semiconductor device isolating methods.

BACKGROUND OF THE INVENTION

As the integration density of integrated circuits increases, the size of individual active devices such as transistors in the integrated circuit device generally tends to shrink. As the device size shrinks, it is also generally desirable to reduce the size of the device isolation areas in the integrated circuit, which are used to electrically isolate adjacent devices. Moreover, it also is generally desirable to form planarized device isolation areas, because the device isolation areas generally are formed early in the fabrication of a semiconductor device. Accordingly, the planarity of the device isolation areas may determine the process margins of subsequent processes. In view of the above, many device isolating methods have been proposed.

There are two main integrated circuit device isolating methods: LOCal Oxidation of Silicon (LOCOS) isolation and trench isolation. The LOCOS method performs a local or selective oxidation of portions of a silicon layer, to thereby form silicon dioxide isolation layers. Trench isolation methods form insulation-containing trenches in the integrated circuit, for device isolation.

The LOCOS method is generally relatively simple. However, in highly integrated circuits, such as dynamic random access memories (DRAMs) beyond 256M capacity, the effectiveness of the LOCOS method may begin to decrease. In particular, as isolation spacings become narrower, the LOCOS method may become less effective due to field oxide thinning as well as punchthrough caused by a bird's beak which is generated during field oxidation.

The trench isolation method may overcome the problems of the LOCOS method. For example, since the trench isolation method does not rely on a thermal oxidation process, it can reduce or eliminate thermal oxidation-related problems. Moreover, narrower device isolation areas may be obtained because the width of the isolation area is generally determined by the width of a trench which may be formed in an integrated circuit substrate. Unfortunately, however, trench isolation methods may be complex and may increase device costs.

A technique for suppressing generation of a bird's beak using a modified LOCOS method is disclosed in "*A Highly Practical Modified LOCOS Isolation Technology for the 256 Mbit DRAM*", IDEM pp. 679–682, 1994. FIGS. 1A–1D describe this modified LOCOS method.

Referring now to FIG. 1A, a stress-relief pad oxide layer 15 and a nitride layer 20 are sequentially formed on an integrated circuit substrate 10. The pad oxide layer 15 in a field region of the integrated circuit substrate is exposed, by removing the nitride layer using photolithography.

Referring to FIG. 1B, a thin thermal oxide layer 25 is then formed in the field region, by removing the exposed pad oxide layer 15, etching the field region of the integrated circuit 10 to a predetermined depth, to thereby form a recessed field region, and performing a thermal oxidation.

Still referring to FIG. 1B, polysilicon is deposited on the entire structure and then isotropically etched to thereby form polysilicon spacers 30 on the sidewalls of the nitride layer 20.

Referring now to FIG. 1C, a field oxide film 35 is then formed in the field region of the integrated circuit substrate 10 by performing a thermal oxidation of the integrated circuit at a high temperature. As shown in FIG. 1C, the polysilicon spacers 30 and portions of the integrated circuit substrate 10 are oxidized.

Finally, referring to FIG. 1D, the nitride layer 20 and pad oxide layer 15 are removed. A sacrificial oxide layer (not shown) is then grown. The field oxide film of FIG. 1C is then planarized to produce the field oxide film 35 of FIG. 1D. It will be understood that in the conventional method described above, the spacers 30 may be formed of nitride as well as polysilicon. Polysilicon may be used to reduce the step difference between the active region and the device isolation area. Also, polysilicon spacers 30 may decrease the leakage current, compared to a nitride layer.

Unfortunately, as shown in FIG. 1D, the above conventional method may have a disadvantage in that the size of the bird's beak may sharply change depending upon the thickness of the polysilicon spacers 30. Furthermore, although thin spacers are generally used due to the narrow device isolation areas in highly integrated devices, the bird's beak may actually become larger because the spacer is relatively thick.

SUMMARY OF THE INVENTION

It is therefore an object of the present invention to provide improved integrated circuit device isolating methods.

It is another object of the present invention to provide integrated circuit device isolating methods which can use local oxidation with silicon, without requiring generation of an excessively large bird's beak.

These and other objects are provided, according to the present invention, by forming an oxidation barrier film on the silicon spacers and on the oxide layer between the silicon spacers, and then oxidizing the integrated circuit substrate through the oxidation barrier film to form a device isolating layer. More particularly, a masked integrated circuit substrate, including mask sidewalls, a silicon spacer on the mask sidewalls, and an oxide layer on the integrated circuit substrate between the silicon spacer on the mask sidewalls, is formed. An oxidation-barrier film is formed on the silicon spacer and on the oxide layer. The integrated circuit substrate is oxidized through the oxidation barrier film to form a device isolating layer. The oxidation barrier film is preferably silicon nitride and preferably is thinner on the oxide layer than on the silicon spacer. Thus, the generation of a bird's beak can be reduced or eliminated, since oxidation of the silicon spacer is delayed by the difference in thickness between the nitride layer on the silicon spacer and on the oxide layer.

In a first embodiment of the present invention, a pad oxide layer is formed on an integrated circuit substrate. A mask pattern is formed on the pad oxide layer. The mask pattern includes sidewalls which selectively expose the pad oxide layer therebetween. A silicon spacer is formed on the sidewalls. An oxidation-barrier film is formed on the silicon spacer and on the exposed pad oxide layer. The integrated circuit substrate is then oxidized through the oxidation barrier film to form a device isolating layer.

The oxidation barrier film is preferably formed on the silicon spacer, on the exposed pad layer and on the mask pattern. After the oxidizing step, the mask pattern and the pad oxide layer may be removed.

In an alternate embodiment of the present invention, the following steps are performed between the steps of forming a mask pattern and forming a silicon spacer: The pad oxide layer is removed from between the sidewalls to expose the integrated circuit substrate between the sidewalls. An oxide layer is then formed on the exposed integrated circuit substrate. Moreover, prior to forming the oxide layer on the exposed substrate, the pad oxide layer between the substrate and the sidewalls may be undercut.

The silicon spacer is preferably selected from the group consisting of monocrystalline, polycrystalline and amorphous silicon. As already described, the oxidation barrier film on the exposed pad oxide layer is preferably thinner than the oxidation barrier film on the silicon spacer. The oxidation barrier film preferably comprises silicon nitride.

According to another alternate embodiment of the present invention, a first pad oxide layer is formed on an integrated circuit substrate. A mask pattern is formed on the first pad oxide layer. The mask pattern includes sidewalls which selectively expose the first pad oxide layer therebetween. The first pad oxide layer is removed from the integrated circuit substrate, between the sidewalls. The substrate between the sidewalls is then recessed, for example by etching. A second pad oxide layer is formed on the recessed substrate between the sidewalls. The silicon spacer is formed on the sidewalls. An oxidation barrier is formed on the sidewalls and on the second pad oxide layer. The integrated circuit substrate is then oxidized through the oxidation barrier film to form a device isolating layer.

Accordingly, generation of a bird's beak can be reduced and preferably eliminated because oxidation of the silicon spacers is delayed due to the difference in thickness between the nitride layer on the silicon spacers and on the oxide layer. Also, the thickness of the silicon spacers can be controlled freely.

DETAILED DESCRIPTION OF PREFERRED EMBODIMENTS

Figure 1A:
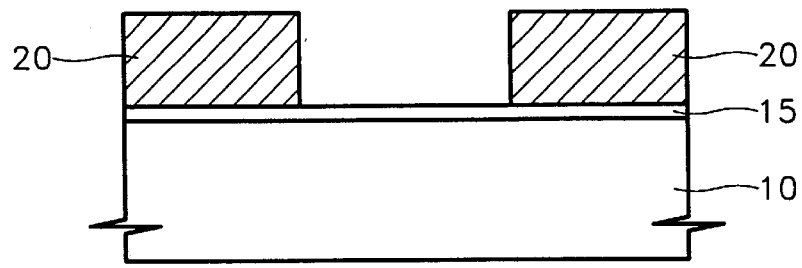
FIGS. 1A through 1D are cross-sectional views for explaining a conventional device isolating method using polysilicon spacers.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will also be understood that when a layer is referred to as being "on" another layer or substrate, it can be directly on the other layer or substrate, or intervening layers may also be present.

Figure 2A:
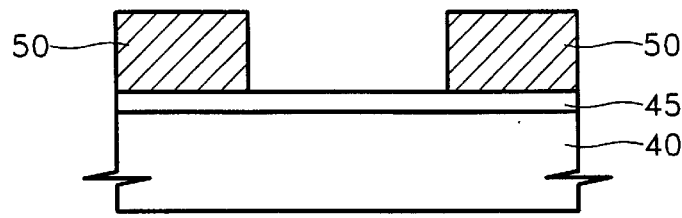
FIGS. 2A through 2E are cross-sectional views of integrated circuit device isolating methods according to a first embodiment of the present invention.

FIGS. 2A through 2E are cross-sectional views of a first embodiment of the present invention. FIG. 2A illustrates the step of forming a mask pattern for defining an active region. As shown, a pad oxide layer 45 is formed by growing a thin thermal oxide layer on an integrated circuit such as a semiconductor substrate 40. A nitride layer 50 is formed on the pad oxide layer 45, and a photoresist pattern (not shown) is formed on the nitride layer 50 to expose the nitride layer in an inactive region. Then, the pad oxide layer 45 in the field region is exposed by dry etching the nitride layer 50 using the photoresist pattern as a mask.

Thus, nitride layer 50 forms a mask pattern, on the pad oxide layer. The mask pattern includes sidewalls which selectively expose the pad oxide layer therebetween.

During a thermal oxidation for forming a field oxide film, the pad oxide layer 45 relieves stress applied to the substrate, while the nitride layer 50 is used as an oxidation-barrier layer for preventing oxidation of the substrate 40 in the active region.

Figure 2B:
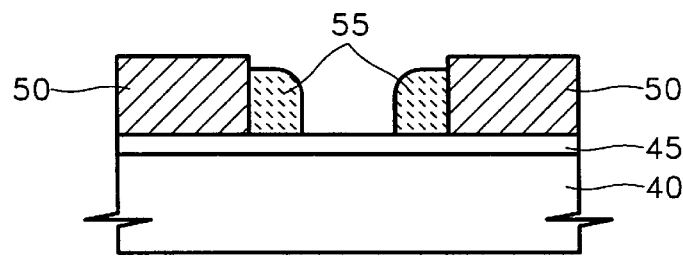

FIG. 2B illustrates the step of forming spacers 55. In this step, a silicon film, for example polysilicon, is deposited on the resultant structure including on the exposed pad oxide layer 45 in the field region, and the spacers 55 are formed on sidewalls of the nitride layer 50 by dry-etching the polysilicon. The spacers 55 are formed of a material or materials selected from the group consisting of monocrystalline silicon, polycrystalline silicon (polysilicon) and amorphous silicon.

The height of spacers 55 may be decreased by overetching the polysilicon using dry-etching. An excessively high spacer may cause the edges of a final device isolation layer to lift upward, which may generate a stringer on a gate film and may deteriorate the gate oxide characteristics.

Figure 1B:
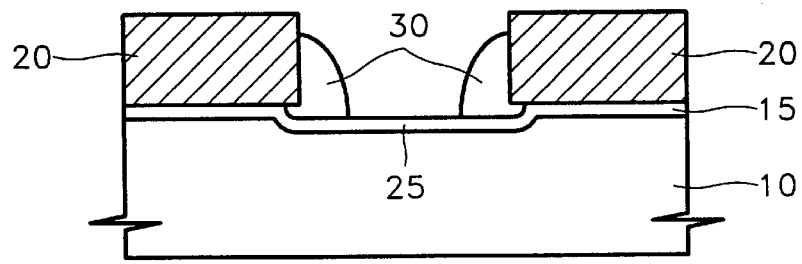
Figure 1C:
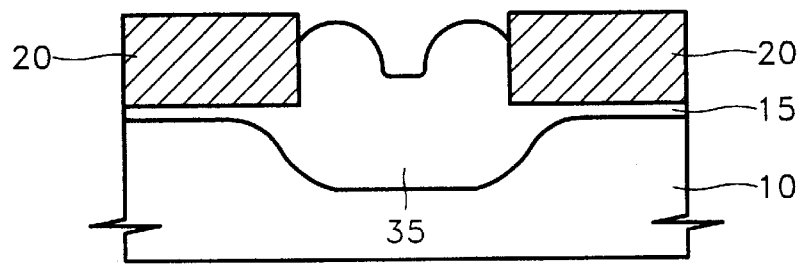
Figure 1D:
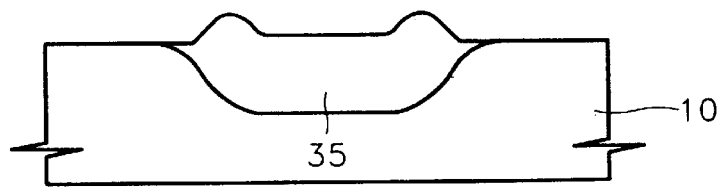

Prior to formation of the polysilicon spacers 55, a thermal oxide layer can be formed by removing the pad oxide layer in a field region and recessing a semiconductor substrate to a predetermined depth, then thermally oxidizing the recessed semiconductor substrate, as shown in FIG. 1B.

Figure 2C:
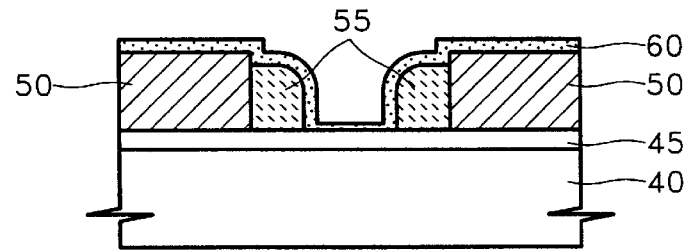
Figure 3:
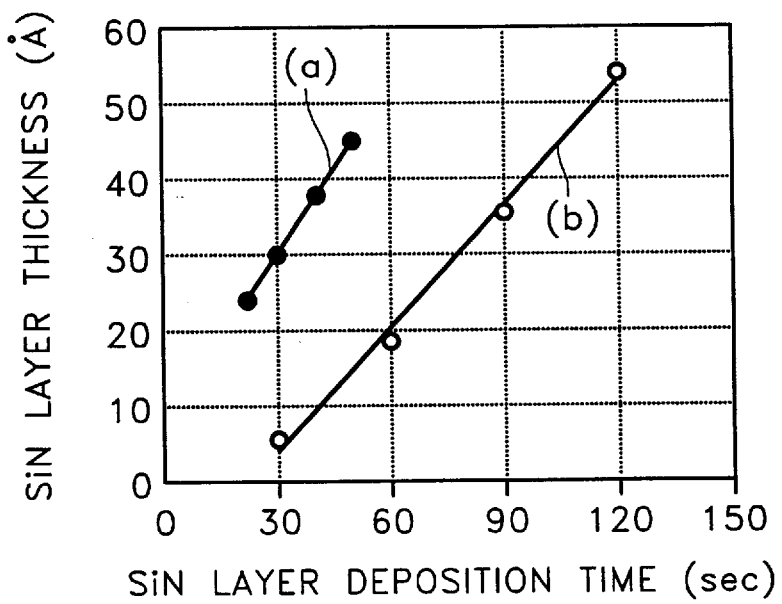
FIG. 3 is a graph showing the thicknesses of nitride films deposited on an oxide film and a silicon film, measured by an Ellipsometer.
Figure 4:
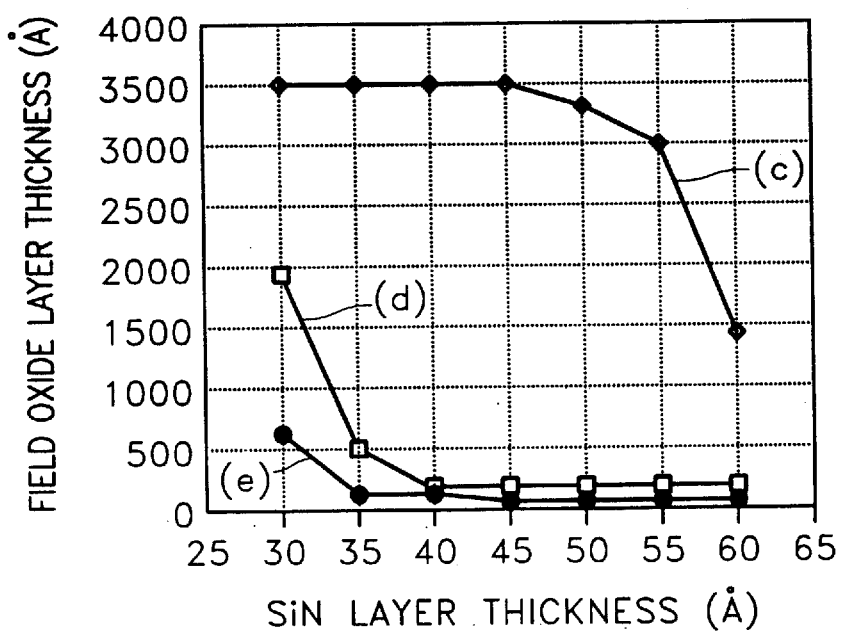
FIG. 4 is a graph showing the resistance against oxidation of a nitride film on a bare wafer, an oxide film, and a polysilicon film.

FIG. 2C illustrates the step of forming an oxidation-barrier film 60. The oxidation-barrier film 60 is formed by depositing a nitride film to a thickness of 10 nm or less on the overall surface of the resultant structure including on the polysilicon spacers 55. The oxidation-barrier film 60 deposited on the nitride layer 50 and on the polysilicon spacers 55 is thicker than the oxidation-barrier film deposited on the pad oxide layer 45. The reason for this thickness difference is illustrated in FIGS. 3 and 4, and will be described below.

It is preferable to deposit the oxidation-barrier film 60 by using equipment having a load lock system. If using equipment without a load lock system, a native oxide layer may be formed on the polysilicon spacers while the substrate is loaded and the temperature of deposition equipment is increased, which may impede selective deposition of a thick oxidation-barrier film on the spacer.

Figure 2D:
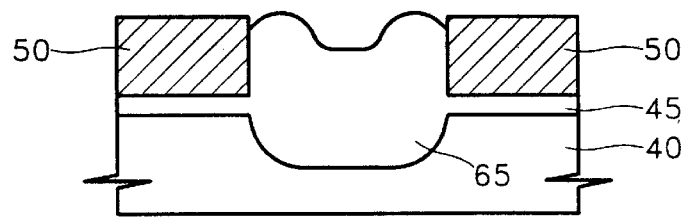

FIG. 2D illustrates the step of oxidizing the semiconductor substrate through the oxidation-barrier film to form a device isolating layer. The device isolating layer, in the form of field oxide layer 65, is formed by performing a thermal oxidation on the resultant structure having the oxidation-barrier film deposited thereon. Oxidation time and process conditions should be properly controlled in order to form the field oxide layer to an intended thickness. Preferably, the oxidation-barrier film formed on the pad oxide layer is wholly oxidized and the substrate is then oxidized.

Since the oxidation-barrier film is thicker on the polysilicon spacers than on the pad oxide layer, the polysilicon spacers resist oxidation for some time after the oxidation begins. Thereafter, after the oxidation-barrier film deposited on the polysilicon spacers is completely oxidized, the polysilicon spacers and the substrate below the polysilicon spacers are oxidized simultaneously. That is, oxidation of the polysilicon spacers can be delayed by the difference between the thicknesses of the oxidation-barrier film on the polysilicon spacers and on the pad oxide layer.

The present invention can thereby avoid problems encountered in conventional device isolating methods using polysilicon spacers. For example, the present invention can avoid incomplete suppression of a bird's beak which is generated due to the early oxidation of the polysilicon spacers. Furthermore, the parameter involved in forming a field oxide layer to an intended thickness generally is the thickness of the polysilicon spacers in the prior art, but generally is the thickness of the oxidation-barrier film formed on the pad oxide layer in the present invention. Therefore, the thickness of the polysilicon spacers can be well controlled.

Figure 2E:
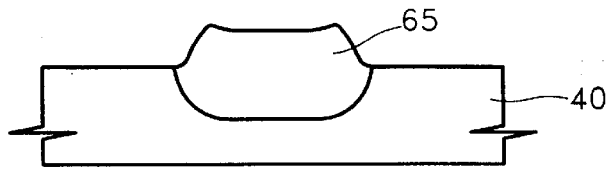

Finally, FIG. 2E illustrates the step of forming a final field oxide layer. The final field oxide layer 65 can be obtained by sequentially removing the nitride layer deposited in the active region and the pad oxide layer.

FIGS. 3 and 4 are graphs which show that nitride layers are deposited to different thicknesses on a silicon layer and on an oxide layer. In particular, FIG. 3 is a graph of the thicknesses of the nitride layer on the oxide layer and the silicon layer, measured by an Ellipsometer. As illustrated, the nitride layer (b) deposited on the oxide layer is thicker than the nitride layer (a) deposited on the silicon layer.

FIG. 4 is a graph showing the growth of nitride layers deposited on a bare wafer, an oxide layer, and a polysilicon layer. Here, the nitride layers are deposited to increasing thicknesses of 0.5 nm, in the range of 3–6 nm, on a 6 nm thick oxide layer (c), a 500 nm thick polysilicon layer (d), and a bare wafer (e). Then a 350 nm field oxide film is grown.

As shown, field oxide layers are grown relatively thin on the bare wafer and on the polysilicon layer. The reason is that the nitride layer deposited on the oxide layer is thinner than the nitride layers deposited on the bare wafer and the polysilicon layer.

Figure 5A:
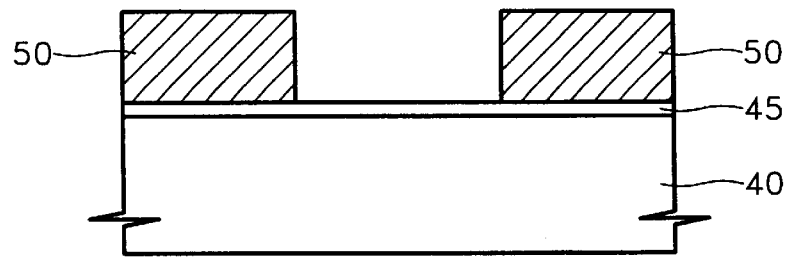
FIGS. 5A through 5F are cross-sectional views of integrated circuit device isolating methods according to a second embodiment of the present invention.

FIGS. 5A through 5F are cross-sectional views of a second embodiment of the present invention. FIG. 5A illustrates the step of forming a mask pattern for defining an active region. As shown, a first pad oxide layer 45 is formed by growing a thin thermal oxide layer on a semiconductor substrate 40. Then, a nitride layer 50 is formed on the first pad oxide layer 45, and a photoresist pattern (not shown) is formed on the nitride layer 50 to expose the nitride layer in a field region. Subsequently, the first pad oxide layer 45 is exposed in the field region by dry etching the nitride layer 50 using the photoresist pattern as a mask.

Figure 5B:
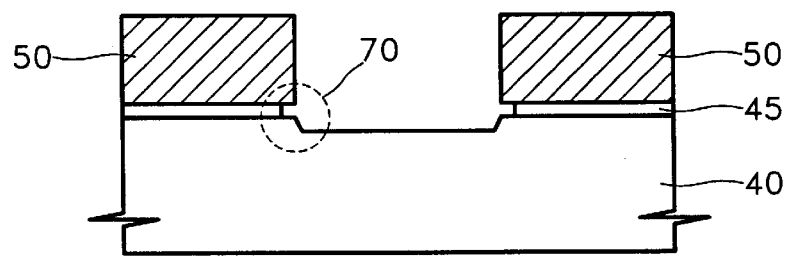

FIG. 5B illustrates the step of forming a trench and an undercut 70. In this step, the photoresist pattern is removed and the surface of the semiconductor substrate 40 is exposed by removing the first pad oxide layer 45 in the field region using the nitride layer 50 as a mask. Then, the semiconductor substrate 40 is recessed by etching to a predetermined depth, and an undercut 70 is formed by etching the side surfaces of the first pad oxide layer 45, between the mask 50 and substrate 40.

Figure 6:
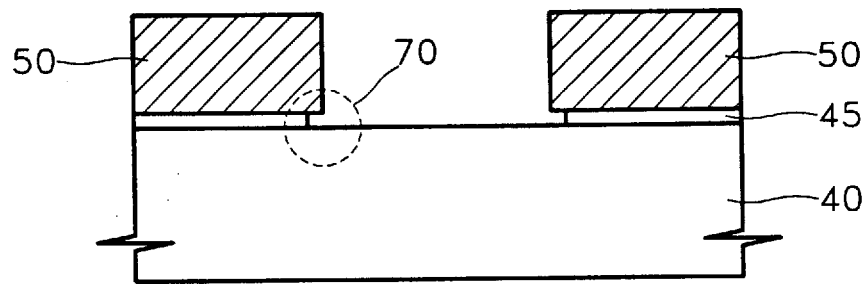
FIG. 6 is a cross-sectional view of a third embodiment of the present invention.

The semiconductor substrate 40 is preferably etched to a depth of 100 nm or less. The predetermined-depth recess of the semiconductor substrate may be used to increase the isolation length. It will be understood that the undercut may be formed by directly etching the side surfaces of the pad oxide layer 45 without recessing the semiconductor substrate. FIG. 6 is a cross-sectional view of the undercut 70 directly formed without recessing the semiconductor substrate 40. The undercut 70 of FIG. 6 can be formed by isotropically etching the exposed side surfaces of the first pad oxide layer 45, between the mask 50 and substrate 40.

A photoresist may be used as an etch mask during the etch process for recessing the semiconductor substrate. Since the etching selectivity of the nitride layer and silicon layer is generally low, recessing the semiconductor substrate using the nitride layer as a mask may consume the nitride layer considerably. Consumption of the nitride layer may be prevented by removing the photoresist pattern after defining the active region, etching the exposed first pad oxide layer, and then recessing the semiconductor substrate as desired.

Figure 5C:
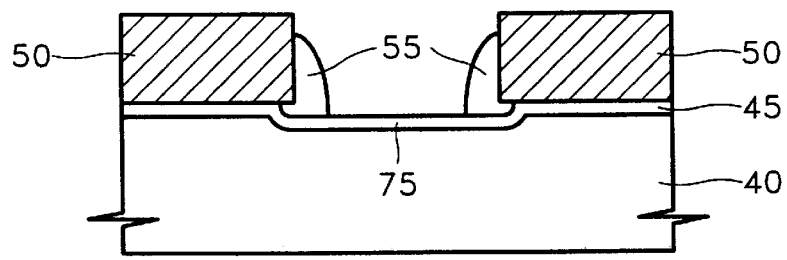

FIG. 5C illustrates the step of forming spacers 55, in which a second pad oxide layer 75 is formed by growing a thin thermal oxide layer in the exposed area of the semiconductor substrate. Polysilicon is deposited on the resultant structure, and the spacers 55 are formed on the sidewalls of the nitride layer 50 and the first oxide layer 45 by etching back the polysilicon.

It is preferable to overetch the polysilicon to an appropriate degree during etch-back of the polysilicon to decrease the height of the polysilicon spacers 55. Decreased height may be preferred to facilitate planarization in subsequent steps. The spacers 55 are formed of a material or materials selected from the group consisting of monocrystalline silicon, polysilicon and amorphous silicon.

Figure 5D:
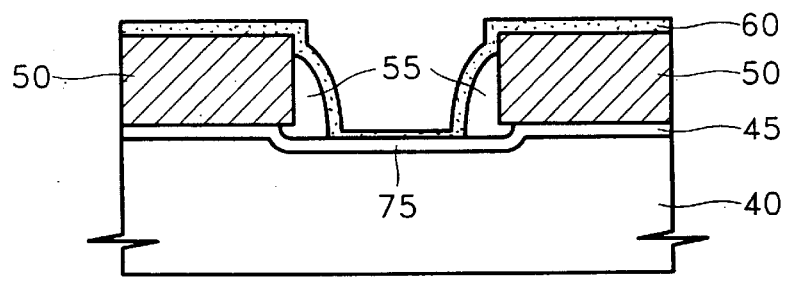

FIG. 5D illustrates the step of forming an oxidation-barrier film 60. The oxidation-barrier film 60 is formed by depositing a nitride layer to a thickness of 10 nm or less on the overall surface of the resultant structure including on the polysilicon spacers 55. The oxidation-barrier film deposited on the nitride layer 50 and on the polysilicon spacers 55 is thicker than the oxidation-barrier film deposited on the second pad oxide layer 75. The reason for this thickness difference has already been described.

Figure 5E:
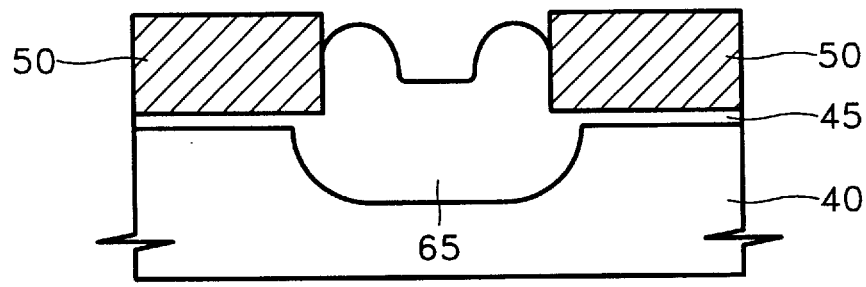

FIG. 5E illustrates the step of oxidizing the semiconductor substrate through the oxidation barrier film to form a device isolating layer. The device isolating layer, in the form of field oxide layer 65, is formed by performing a thermal oxidation of the resultant structure having the oxidation-barrier film deposited thereon. Oxidation time and process conditions should be properly controlled so that a field oxide film is formed to an intended thickness. Preferably, the oxidation-barrier film formed on the second pad oxide layer is wholly oxidized and the substrate is then oxidized.

The oxidation-barrier film deposited on the polysilicon spacers is thicker than that deposited on the second pad oxide layer. Therefore, the polysilicon spacers resist oxidation for some time after oxidation begins, and then are oxidized together with the substrate below the polysilicon spacers after the oxidation-barrier film deposited the polysilicon spacers is entirely oxidized. Thus, even though the polysilicon spacers are thin, oxidation of the polysilicon spacers may be delayed by the difference between the thickness of the oxidation-barrier film deposited on the polysilicon spacers and on the second pad oxide layer, thereby effectively reducing or suppressing a bird's beak.

Figure 5F:
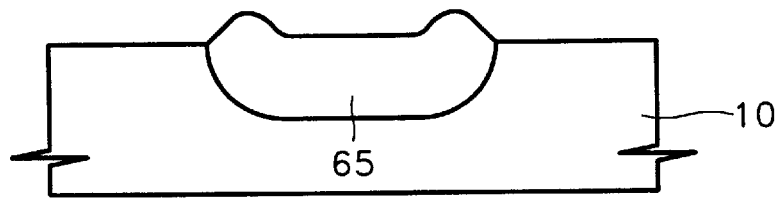

FIG. 5F illustrates the step of forming a final field oxide layer 65. The final field oxide layer 65 is formed by sequentially removing the nitride layer in the active region, and the first pad oxide layer in the active region.

Figure 7B:
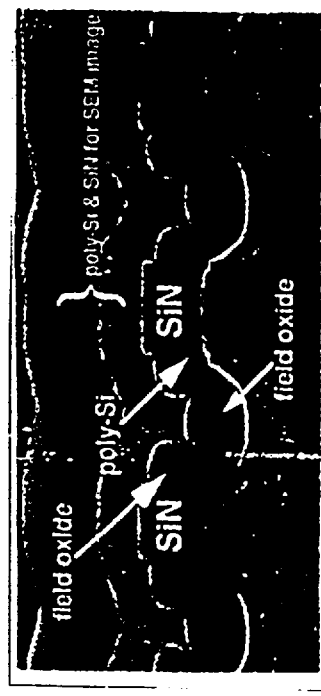
FIGS. 7A through 8B are SEM pictures for explaining the effects of the present invention.
Figure 7A:
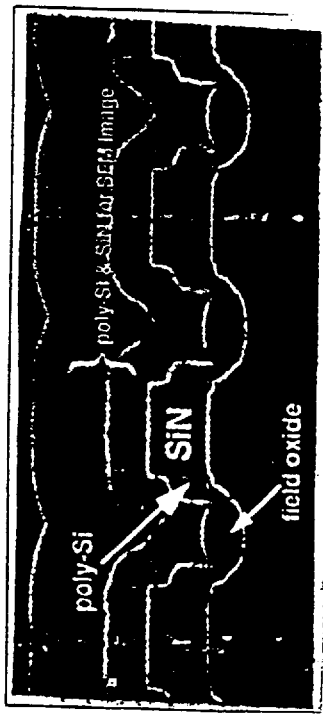

FIG. 7A is an SEM photo of a 120 nm field oxide layer formed according to the present invention. It is understood that the field oxide layer is normally grown in a field region having an insulating film formed therein, but the polysilicon spacer remains without being oxidized. The oxidation of the polysilicon spacer is suppressed for a predetermined time since the oxidation-barrier film is thicker on the polysilicon spacer than on the pad oxide layer.

FIG. 7B is an SEM picture of a 200 nm field oxide layer. It is shown that polysilicon partially remains only on the side surfaces of the nitride layer formed in an active region after the polysilicon spacer begins to be oxidized.

Figure 8B:
Figure 8A:
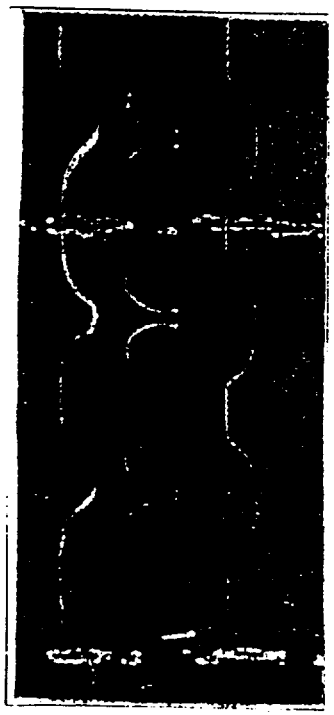

FIGS. 8A and 8B are SEM pictures of a 300 nm field oxide layer grown after a spacer is formed of a 50 nm polysilicon. FIG. 8A shows the case where only the polysilicon spacer is formed, and FIG. 8B illustrates the case where a nitride layer is deposited on the polysilicon spacer and then oxidized. From these pictures, it is noted that deposition of the nitride layer as an oxidation-barrier film markedly suppress the bird's beak. Since the nitride layer is thinner in the field region where a field oxide layer is to be formed, the oxidation of the field region begins earlier.

According to isolating methods of the present invention, a nitride layer is selectively formed in a field region to be thinner than on polysilicon spacers, relying on the difference between the thicknesses of nitride layers deposited on a silicon layer and on an oxide layer. Therefore, oxidation of the polysilicon spacers is delayed by the difference in the thickness of the nitride layers deposited on the polysilicon spacers and on the pad oxide layer. Thus, although a bird's beak may not be sufficiently suppressed due to early oxidation of polysilicon in conventional isolating methods using polysilicon spacers, the generation of the bird's beak can be suppressed in the present invention.

Further, the parameter for forming a field oxide film to a desirable thickness is the thickness of the polysilicon spacers in the prior art, but is that of the nitride layer formed on the pad oxide layer in the present invention. Therefore, the thickness of polysilicon spacers can be freely controlled in the present invention. In addition, since the polysilicon spacers can be formed thin, the open field region may be increased. Thus, field oxide thinning may be reduced and a high quality device can be formed.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. An integrated circuit device isolating method comprising the steps of:
    forming a pad oxide layer on an integrated circuit substrate;
    forming a mask pattern on said pad oxide layer, said mask pattern including sidewalls which selectively expose said pad oxide layer therebetween;
    forming a silicon spacer on said sidewalls;
    forming an oxidation-barrier film on said silicon spacer and on said exposed pad oxide layer; and
    oxidizing said integrated circuit substrate through said oxidation-barrier film to form a device isolating layer.

2. A method according to claim 1 wherein said step of forming an oxidation-barrier film comprises the step of forming an oxidation-barrier film on said silicon spacer, on said exposed pad layer and on said mask pattern.

3. A method according to claim 1 wherein said oxidizing step is followed by the step of:
    removing said mask pattern and said pad oxide layer.

4. A method according to claim 1 wherein the following steps are performed between said steps of forming a mask pattern and forming a silicon spacer:
    removing said pad oxide layer from between said sidewalls to expose said integrated circuit substrate between said sidewalls; and
    forming an oxide layer on said exposed integrated circuit substrate.

5. A method according to claim 4 wherein the following step is performed between said steps of removing said pad layer and forming an oxide layer:
    undercutting said pad oxide layer between said integrated circuit substrate and said sidewalls.

6. A method according to claim 1 wherein said silicon spacer is selected from the group consisting of monocrystalline, polycrystalline and amorphous silicon.

7. A method according to claim 1 wherein said step of forming an oxidation-barrier film on said silicon spacer and on said exposed pad oxide layer comprises the step of forming an oxidation-barrier film on said exposed pad oxide layer which is thinner than said oxidation-barrier film on said silicon spacer.

8. A method according to claim 1 wherein said oxidation-barrier film comprises nitride.

9. An integrated circuit device isolating method comprising the steps of:
    forming a first pad oxide layer on an integrated circuit substrate;
    forming a mask pattern on said first pad oxide layer, said mask pattern including sidewalls which selectively expose said first pad oxide layer therebetween;
    removing said first pad oxide layer from said integrated circuit substrate, between said sidewalls;
    recessing said integrated substrate between said sidewalls;
    forming a second pad oxide layer on said recessed integrated circuit substrate between said sidewalls;
    forming a silicon spacer on said sidewalls;
    forming an oxidation-barrier film on said silicon spacer and on said second pad oxide layer; and
    oxidizing said integrated circuit substrate through said oxidation-barrier film to form a device isolating layer.

10. A method according to claim 9 wherein said step of forming an oxidation-barrier film comprises the step of forming an oxidation-barrier film on said silicon spacer, on said second pad layer and on said mask pattern.

11. A method according to claim 9 wherein said oxidizing step is followed by the step of:
    removing said mask pattern and said first pad oxide layer.

12. A method according to claim 9 wherein the following step is performed between said steps of removing said first pad layer and forming a second pad oxide layer:
    undercutting said first pad oxide layer between said integrated circuit substrate and said sidewalls.

13. A method according to claim 9 wherein said silicon spacer is selected from the group consisting of monocrystalline, polycrystalline and amorphous silicon.

14. A method according to claim 9 wherein said step of forming an oxidation-barrier film on said silicon spacer and on said exposed pad oxide layer comprises the step of forming an oxidation-barrier film on said exposed pad oxide layer which is thinner than said oxidation-barrier film on said silicon spacer.

15. A method according to claim 9 wherein said oxidation-barrier film comprises nitride.

16. An integrated circuit device isolating method comprising the steps of:
   forming a masked integrated circuit substrate including mask sidewalls, a silicon spacer on said mask sidewalls, and an oxide layer on said integrated circuit substrate between said silicon spacer on said mask sidewalls;
   forming an oxidation-barrier film on said silicon spacer and on said oxide layer; and
   oxidizing said integrated circuit substrate through said oxidation-barrier film to form a device isolating layer.

17. A method according to claim 16 wherein said step of forming an oxidation-barrier film comprises the step of forming an oxidation-barrier film on said silicon spacer, on said oxide layer and on said mask.

18. A method according to claim 16 wherein said silicon spacer is selected from the group consisting of monocrystalline, polycrystalline and amorphous silicon.

19. A method according to claim 16 wherein said step of forming an oxidation-barrier film on said silicon spacer and on said oxide layer comprises the step of forming an oxidation-barrier film on said oxide layer which is thinner than said oxidation-barrier film on said silicon spacer.

20. A method according to claim 16 wherein said oxidation-barrier film comprises nitride.

\* \* \* \* \*